United States Patent
Brusic et al.

(10) Patent No.: US 7,368,066 B2
(45) Date of Patent: May 6, 2008

(54) GOLD CMP COMPOSITION AND METHOD

(75) Inventors: Vlasta Brusic, Geneva, IL (US); Renjie Zhou, Aurora, IL (US); Christopher Thompson, Earlville, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 11/444,866

(22) Filed: May 31, 2006

(65) Prior Publication Data

US 2007/0278184 A1    Dec. 6, 2007

(51) Int. Cl.
*B44C 1/22*    (2006.01)

(52) U.S. Cl. .................. 216/89; 438/692; 438/689; 438/690; 438/693; 438/687; 252/79

(58) Field of Classification Search .............. 216/89; 438/692; 252/79
See application file for complete search history.

(56) References Cited

U.S. PATENT DOCUMENTS

| | | |
|---|---|---|
| 5,044,128 A | 9/1991 | Nakano |
| 5,489,233 A | 2/1996 | Cook et al. |
| 5,527,423 A | 6/1996 | Neville et al. |
| 5,626,715 A | 5/1997 | Rostoker |
| 5,691,219 A | 11/1997 | Kawakubo et al. |
| 5,693,239 A | 12/1997 | Wang et al. |
| 5,868,604 A | 2/1999 | Atsugi et al. |
| 5,958,794 A | 9/1999 | Bruxvoort et al. |
| 6,063,306 A | 5/2000 | Kaufman et al. |
| 6,093,649 A | 7/2000 | Roberts et al. |
| 6,126,853 A | 10/2000 | Kaufman et al. |
| 6,146,244 A | 11/2000 | Atsugi et al. |
| 6,274,063 B1 | 8/2001 | Li et al. |
| 6,290,736 B1 | 9/2001 | Evans |
| 6,293,848 B1 | 9/2001 | Fang et al. |
| 6,350,678 B1 * | 2/2002 | Pramanick et al. ......... 438/633 |
| 6,379,406 B1 | 4/2002 | Thomas et al. |
| 6,527,622 B1 | 3/2003 | Brusic et al. |
| 2002/0081853 A1 | 6/2002 | Beitel et al. |
| 2006/0030158 A1 * | 2/2006 | Carter et al. ............... 438/692 |

\* cited by examiner

*Primary Examiner*—Nadine G. Norton
*Assistant Examiner*—Maki Angadi
(74) *Attorney, Agent, or Firm*—Thomas E. Omholt; Steven D. Weseman; Robert J. Ross

(57) ABSTRACT

The invention provides a cyanide-free chemical-mechanical polishing (CMP) composition useful for polishing a gold-containing surface of a substrate. The CMP composition comprises an abrasive, a gold-oxidizing agent, a cyanide-free gold-solubilizing agent, and an aqueous carrier therefor. The invention further provides a method of chemically-mechanically polishing a gold-containing surface of a substrate with the aforementioned polishing composition.

12 Claims, No Drawings

GOLD CMP COMPOSITION AND METHOD

FIELD OF THE INVENTION

This invention pertains to a chemical-mechanical polishing composition and a method for polishing a gold-containing surface of a substrate using the composition.

BACKGROUND OF THE INVENTION

Compositions and methods for chemical-mechanical polishing (CMP) the surface of a substrate are well known in the art. Polishing compositions (also known as polishing slurries) typically contain an abrasive material in an aqueous carrier. A surface of a substrate is abraded to polish the surface by contacting the surface with a polishing pad and moving the polishing pad relative to the surface while maintaining a CMP slurry between the pad and the surface. Typical abrasive materials include silicon dioxide (silica), cerium oxide (ceria), aluminum oxide (alumina), zirconium oxide (zirconia), and tin oxide. U.S. Pat. No. 5,527,423, for example, describes a method for chemically-mechanically polishing a metal layer by contacting the surface with a polishing slurry comprising high purity fine metal oxide particles in an aqueous medium. Alternatively, the abrasive material may be incorporated into the polishing pad. U.S. Pat. No. 5,489,233 discloses the use of polishing pads having a surface texture or pattern, and U.S. Pat. No. 5,958,794 discloses a fixed abrasive polishing pad.

Conventional polishing systems and polishing methods typically are not entirely satisfactory at planarizing semiconductor wafers. In particular, polishing compositions and polishing pads can have less than desirable polishing rates, and their use in the chemical-mechanical polishing of semiconductor surfaces can result in poor surface quality.

The difficulty in creating an effective polishing system for semiconductor wafers stems from the complexity of the semiconductor wafer. The performance of a given CMP composition generally will vary depending on the composition (e.g., type of metal, type of semiconductor, etc.) of the surface being polished. Semiconductor wafers are typically composed of a substrate, on which a plurality of devices has been formed. Integrated circuits are chemically and physically connected into a substrate by patterning regions in the substrate and layers on the substrate. To produce an operable semiconductor wafer and to maximize the yield, performance, and reliability of the wafer, it is desirable to polish select surfaces of the wafer without adversely affecting underlying structures or topography. In fact, various problems in semiconductor fabrication can occur if the process steps are not performed on wafer surfaces that are adequately planarized. Because the performance of a semiconductor wafer is directly associated with the planarity of its surface, it is crucial to use a polishing composition and method that results in a high polishing efficiency, uniformity, and removal rate and leaves a high quality polish with minimal surface defects.

Various metals and metal alloys have been used to form electrical connections between interconnection levels and devices, including titanium, titanium nitride, aluminum-copper, aluminum-silicon copper, tungsten, platinum, platinum-tungsten, platinum-tin, ruthenium, gold, and combinations thereof. Gold presents a particular challenge in that it is chemically resistant, making it difficult to remove efficiently through chemical-mechanical polishing.

CMP compositions for etching and processing gold surfaces generally include complexing agents that are highly toxic, such as cyanides, compounds that generate toxic materials, such as thiosulfates, which generates hydrogen sulfide, or oxidizers that are intensely colored, such as $I_2$/KI, which can interfere with optical CMP endpoint detectors.

Accordingly, there is an ongoing need for CMP compositions and polishing methods that exhibit desirable planarization efficiency, uniformity, and removal rate during the polishing and planarization of gold-containing substrates without using highly toxic or highly colored oxidizers.

The present invention provides such a composition and method. These and other advantages of the invention, as well as additional inventive features, will be apparent from the description of the invention provided herein.

BRIEF SUMMARY OF THE INVENTION

The present invention provides an improved, cyanide-free CMP polishing composition that affords efficient removal of gold without the use of cyanide-containing reagents. A chemical-mechanical polishing (CMP) composition of the invention comprises an abrasive, a gold-oxidizing agent, a cyanide-free gold-solubilizing agent, and an aqueous carrier. Advantageously, the CMP compositions of the present invention are colorless or relatively low in color and are cyanide free.

The gold-oxidizing agent is preferably a persulfate salt, a reactive admixture of an oxyhalogen compound and a halide salt, or a combination thereof. A particularly preferred persulfate salt is ammonium persulfate. A particularly preferred reactive admixture of an oxyhalogen compound and a halide salt is a mixture of an iodate compound and an iodide salt.

In some preferred embodiments the solubilizing agent comprises a phosphonic acid chelating agent (e.g., aminotris(methylenephosphonic acid) or hydroxyethylidene-1,1-diphosphonic acid).

In embodiments in which the gold-oxidizing agent is a reactive admixture of an oxyhalogen compound and a halide salt, the admixture also acts as a cyanide-free gold-solubilizing agent species formed during CMP. If desired, such CMP compositions can include a separate solubilizing agent, such as a phosphonic acid chelating agent, in addition to the admixture of oxyhalogen compound and halide salt; however, an additional solubilizer is not required. Preferably, the oxyhalogen compound and the halide salt are combined with other components of the CMP composition just prior to contacting the CMP composition with a substrate to be polished, or are admixed with the other components of the CMP composition right on the surface of the substrate. Under such conditions, free halogen is rapidly formed and can immediately react with gold in the substrate, thus avoiding a build-up of free halogen, and avoiding potential storage problems that could occur if the oxyhalogen compound and the halide salt are admixed for a relatively lengthy period prior to use.

A chemical-mechanical polishing (CMP) method of the present invention comprises contacting a gold-containing surface of a substrate with a polishing pad and a cyanide-free CMP composition of the invention for a time period sufficient to oxidize gold on the surface of the substrate. The CMP composition comprises an abrasive, a gold-oxidizing agent, a cyanide-free gold-solubilizing agent, and an aqueous carrier. Polishing is effected by causing relative motion between the pad and the substrate while maintaining a portion of the CMP composition in contact with the surface between the pad and the substrate for a time sufficient to abrade a portion of the surface with the CMP composition.

For example, the pad can be rotated while contacting a rotating platen having a substrate mounted therein. The CMP composition is fed onto the surface of the substrate in a manner such that a portion of the CMP composition contacts the surface of the substrate between the pad and the substrate.

When utilized to polish a surface comprising gold, the compositions and methods of the present invention provide for efficient removal of gold from the surface of the substrate without utilizing hazardous cyanide-containing reagents.

DETAILED DESCRIPTION OF THE INVENTION

The invention provides a cyanide-free chemical-mechanical polishing composition useful for polishing a gold-containing surface of a substrate. The CMP compositions of the invention comprise an abrasive (e.g., alumina), a gold-oxidizing agent, a cyanide-free gold-solubilizing agent (i.e., a material that is capable of solubilizing oxidized gold species, e.g., Au(+3) and Au(+1) species), and an aquEous carrier therefor. The cyanide-free gold-solubilizing agent and the gold-oxidizing agent can comprise the same material or different materials. Advantageously, the CMP compositions of the present invention are cyanide-free, thus avoiding the waste disposal and toxicity problems associated with conventional gold CMP compositions.

Any suitable abrasive can be utilized in the CMP compositions and methods of the present invention. Preferably, the abrasive comprises alpha-alumina. In some preferred embodiments the abrasive comprises a surface-treated alpha-alumina. Surface treated alpha-alumina are well known in the CMP art and are described, for example, in U.S. Pat. No. 6,258,137 to Garg et al.

The abrasive particles desirably have an average particle size (typically, average particle diameter of the smallest spheres encompassing the particles) of at least about 10 nm, preferably in the range of about 10 to about 1000 nm, as determined by light scattering. More preferably, the abrasive particles have an average particle size in the range of about 50 to about 500 nm.

The abrasive can be present in the polishing composition in any suitable amount. The amount of abrasive present in the polishing composition typically is at least about 0.001 percent by weight. The amount of abrasive present in the polishing composition preferably is about 5 percent by weight or less. More preferably, the amount of abrasive present in the polishing composition is about 0.1 to about 3% by weight.

The abrasive desirably is suspended in the polishing composition, more specifically in the aqueous carrier portion of the polishing composition. When the abrasive is suspended in the aqueous carrier, the abrasive preferably is colloidally stable (i.e., the particles remain suspended in the carrier for a prolonged period of time). In the context of this invention, an abrasive is considered colloidally stable if, when the abrasive is placed into a 100 mL graduated cylinder and allowed to stand without agitation for a period of about 2 hours, the difference between the concentration of particles in the bottom 50 mL of the graduated cylinder ([B] in terms of g/mL) and the concentration of particles in the top 50 mL of the graduated cylinder ([T] in terms of g/mL) divided by the total concentration of particles in the abrasive composition ([C] in terms of g/mL) is less than or equal to 0.5 (i.e., ([B]−[T])/[C]≦0.5). The value of ([B]−[T])/[C] desirably is less than or equal to 0.3, and preferably is less than or equal to 0.1.

The CMP compositions of the invention utilizing a persulfate salt as the gold-oxidizing agent preferably have a basic pH (e.g., a pH in the range of about 8 to about 10). More, preferably, CMP compositions comprising a persulfate salt a an oxidizer have a pH in the range of about 9 to about 9.5. CMP compositions containing a halogen or a reactive admixture of an oxyhalogen compound and a halide salt preferably have an acidic pH (i.e., a pH of about 7 or less, preferably in the range of about 3 to about 7, most preferably about 5). The CMP composition optionally comprises one or more pH adjusting agent, for example, potassium hydroxide, ammonium hydroxide, alkylammonium hydroxides, and/or nitric acid. The polishing composition can optionally comprise pH buffering agents, such as ammonium acetate or disodium citrate. Many such pH buffering agents are well known in the art.

Suitable gold-oxidizing agents include, without limitation, persulfate salts, halogens, reactive admixtures of oxyhalogen compounds and halide salts, which generate halogens, and a combination of two or more of the foregoing. Preferably, the gold-oxidizing agent is present in the composition in an amount in the range of about 0.5 to about 6% by weight.

In some preferred embodiments the gold-oxidizing agent is a persulfate salt such as a monopersulfate salt (i.e. $SO_5^{-2}$) or a dipersulfate salt (i.e., $S_2O_8^{-2}$). A preferred persulfate salt is ammonium persulfate, $(NH_4)_2S_2O_8$. Preferably, the persulfate salt is present in the CMP composition at a concentration in the range of about 0.5 to about 6 percent by weight, more preferably about 1 to about 4 percent by weight. Potassium permanganate can be used, as well, although a separate surface cleaning step may be necessary to remove manganese dioxide formed during the gold oxidation process.

In other preferred embodiments the gold-oxidizing agent is a reactive admixture comprising an oxyhalogen compound and a halide salt. Such reactive admixtures typically generate a halogen e.g., $I_2$, $Br_2$, and or $Cl_2$) in situ, which is capable of oxidizing gold under the conditions utilized in chemical mechanical polishing of gold-containing substrates such as integrated circuit chips, and the like. Examples of suitable oxyhalogen compounds include iodate compounds such as potassium iodate ($KIO_3$) or potassium hydrogen iodate (a 1:1 mixture of $HIO_3$ acid and $KIO_3$), bromate ($BrO_3^{-1}$) compounds, chlorate ($ClO_3^{-1}$) compounds, and the like. Preferably, the halogen salt in the admixture is chosen to complement the oxyhalogen component (i.e., to include the same halogen atom). For example, an iodide preferably is utilized in combination with an iodate compound, a bromide preferably is utilized in combination with a bromate compound, and a chloride preferably is utilized in combination with a chlorate compound. Preferably, the oxyhalogen compound is present in the CMP composition at a concentration in the range of about 0.5 to about 6 percent by weight (e.g., about 2 percent by weight). The halide preferably is present in the CMP composition at a concentration in the range of about 1 to about 2 percent by weight.

Cyanide-free gold-solubilizing agents useful in the compositions and methods of the present invention include any chemical compound or combination of compounds that can solubilize oxidized gold species, e.g. gold(+3). Non-limiting examples of suitable cyanide-free gold-solubilizing agents include phosphonic acid chelating agents, admixtures of an oxyhalogen compound and a halide salt, acetonitrile, ammonium sulfamate, ammonium sulfite, diethylenetriaminepentaacetic acid and salts thereof, a combination of two or more of the foregoing, and the like.

Non-limiting examples of suitable phosphonic acid chelating agents include, without limitation amino-tris(methylenephosphonic acid) and hydroxyethylidene-1,1-diphosphonic acid, hexamethylenediaminetetra(methylenephosphonic acid), diethylenetriaminepenta(methylenephosphonic acid), salts thereof, and combinations of two or more of the foregoing thereof.

The cyanide-free gold-solubilizing agent preferably is present in the CMP compositions of the present invention in an amount in the range of about 0.5 to about 6 percent by weight, more preferably in the range of about 1 to about 4 percent by weight.

When a reactive admixture of an oxyhalogen compound (e.g., iodate) and a halide salt (e.g., iodide) is utilized as the gold-oxidizing agent, the halide salt can also act as a solubilizing agent for oxidized gold species. Thus, in embodiments utilizing a reactive admixture of an oxyhalogen compound and a halide salt, an additional solubilizing agent can be omitted, if desired.

The aqueous carrier in the CMP compositions of the present invention can be water (e.g., deionized water), or a mixture of water with one or more water-soluble solvent such as a lower alkyl alcohol (e.g., methanol or ethanol), a polyol (e.g., ethylene glycol or glycerin), and the like. Preferably, the aqueous carrier is deionized water.

The polishing composition optionally further comprises one or more other additives. Such additives include any suitable surfactant and/or rheological control agent, including viscosity enhancing agents, coagulants (e.g., polymeric rheological control agents, such as, for example, urethane polymers), acrylates comprising one or more acrylic subunits (e.g., vinyl acrylates and styrene acrylates), polymers, copolymers, and oligomers thereof, and salts thereof. Suitable surfactants include, for example, cationic surfactants, anionic surfactants, anionic polyelectrolytes, nonionic surfactants, amphoteric surfactants, fluorinated surfactants, mixtures thereof, and the like.

The polishing composition optionally can further comprise a biocide. The biocide can be any suitable biocide, for example an isothiazolinone biocide. The amount of biocide used in the polishing composition typically is about 1 ppm to about 500 ppm, and preferably is about 10 ppm to about 200 ppm.

The polishing composition can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., acids, bases, etc.) as well as any combination of ingredients (e.g., acids, bases, surfactants, etc.).

For example, the abrasive can be dispersed in an aqueous solvent, such as deionized water. The gold-oxidizing agent and the solubilizing agent, as well as any other optional component, can then be added, and mixed by any method that is capable of incorporating the components into the polishing composition. The CMP composition can be prepared prior to use, with one or more components, such as the solubilizing agent or gold-oxidizing agent, added to the CMP composition just before use (e.g., within about 1 minute before use, or within about 1 hour before use, or within about 7 days before use). The pH can be adjusted at any suitable time. The CMP composition also can be prepared by mixing the components at the surface of the substrate during the polishing operation.

The CMP composition also can be provided as a concentrate which is intended to be diluted with an appropriate amount of water prior to use. In such an embodiment, the polishing composition concentrate can comprise an abrasive, a gold-oxidizing agent, a solubilizing agent, and an aqueous carrier in amounts such that, upon dilution of the concentrate with an appropriate amount of aqueous solvent, each component of the polishing composition will be present in the polishing composition in a suitable effective amount.

The invention further provides a method of chemically-mechanically polishing a gold-containing surface of a substrate. The present method utilizes a CMP composition of the present invention (i.e., a CMP composition the CMP composition comprising an abrasive, a gold-oxidizing agent, a cyanide-free gold-solubilizing agent, and an aqueous carrier) The method comprises the steps of (a) contacting a gold-containing surface of a substrate with a polishing pad and a cyanide-free CMP composition of the invention for a time period sufficient to oxidize gold on the surface of the substrate; and (b) causing relative motion between the pad and the surface while maintaining a portion of the CMP composition in contact with the surface between the pad and the substrate for a time sufficient to abrade the oxidized portion of the surface with the CMP composition.

The method of the present invention can be used to polish any suitable substrate, and is especially useful for polishing surfaces of substrates comprising gold.

When the gold-oxidizing agent in the CMP composition of the invention is a reactive admixture of oxyhalogen compound and a halide salt it is desirable to keep these two materials separate until just prior to use. Accordingly, when the CMP composition comprises an oxyhalogen compound, (e.g., potassium iodate, potassium hydrogen iodate, and the like) and a halide salt, it is preferred that the oxyhalogen compound and the halide salt are kept separate from one another and are only admixed just prior to contacting the surface of the substrate, or are admixed on the surface of the substrate, itself. The abrasive component of the CMP composition can be included in either or both of the separate formulated products. Upon mixing of the two compositions, free halogen is formed, which then reacts with gold present in the substrate.

The CMP method of the invention is particularly suited for use in conjunction with a CMP apparatus in which a polishing pad and platen are in relative motion to one another. Typically, the CMP apparatus comprises a platen, which, when in use, is in motion and has a velocity that results from orbital, linear, or circular motion, a polishing pad in contact with the platen and moving with the platen when in motion, and a carrier attached to the platen, which holds a substrate to be polished so that it can be contacted with the polishing pad. A CMP composition is supplied to the surface to be polished with at least a portion of the CMP composition being disposed between the substrate and the pad. The platen, with its affixed substrate, is moved relative to the surface of the polishing pad for a time period sufficient for the CMP composition between the substrate and the pad to abrade at least a portion of the surface of the substrate.

A substrate can be planarized or polished with the chemical-mechanical polishing composition with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. No. 5,196,353, U.S. Pat. No. 5,433,651, U.S. Pat. No. 5,609,511, U.S. Pat. No. 5,643,046, U.S. Pat. No. 5,658,183, U.S. Pat. No. 5,730,642, U.S. Pat. No. 5,838,447, U.S. Pat. No. 5,872,633, U.S. Pat. No. 5,893,796, U.S. Pat. No. 5,949,927, and U.S. Pat. No. 5,964,643. Desirably, the inspection or monitoring of the progress of the polishing process with respect to a workpiece being polished enables the determination of the polishing end-point, i.e., the determination of when to terminate the polishing process with respect to a particular workpiece.

The following examples further illustrate the invention but, of course, should not be construed as in any way limiting its scope.

EXAMPLE 1

This example shows the effect of varying amounts of a phosphonic acid chelating agent on oxidation and solubilization of gold utilizing electrochemical techniques.

The electrochemical apparatus utilized to evaluate the effects of phosphonic acid chelating agents on the oxidation and solubilization of gold is similar to one normally used in evaluation of metallic corrosion. The apparatus included a three electrode cell, a Princeton Applied Research 273A potentiostat (along with software for electrochemically evaluating corrosion), and a Pine rotator. The electrode cell included a gold electrode (i.e., the working electrode), a platinum counter electrode, and mercurous surface electrode (MSE) as a reference electrode, and an abrasive pad at its bottom. The cell was placed on a scale to select and monitor a down-force used in the tests. Electrochemical data pertinent to metal dissolution was obtained with a rotating electrode pressed against the abrasive pad (with a selected down force), and also with electrode lifted from the pad, i.e., with and after surface abrasion. The data obtained with abrasion are similar to the electrochemical metal dissolution observed during polishing, while the results obtained after abrasion mimic the reactions that occur in valleys of a semiconductor wafer pattern, where abrasion does not play a role. The rates of gold dissolution were evaluated with potentiodynamic potential curves. The potential was varied about 250 mV below the open circuit potential to some value well above that potential, with and without abrasion, for aqueous solutions having a pH of about 9, and containing about 2% ammonium persulfate and about 0.5, 1, 2, and 4% 1-hydroxyethylidene-1,1-diphosphonic acid (DEQUEST® 2010). Differences between data with and without abrasion readily indicated the extent to which the CMP composition is capable of metal passivation and re-passivation.

The gold dissolution rate for each solution was evaluated from the potentiodynamic curves, which were obtained by varying potential and recording current generated by all the reactions on gold. Data with abrasion were obtained with a down force of approximately 2 psi in solutions without an added abrasive (with the abrasive pad providing the needed surface abrasion). The results indicate that additions of a phosphonic acid chelating agent can greatly diminish the passivating properties of the oxide film. The calculated gold dissolution rate was determined to be about 210 Å/min with abrasion and 35 Å/min after abrasion was terminated. The dissolution rates obtained at a potential of 0.2 V relative to MSE at each phosphonate level are recorded in Table 1. The results indicated that in the absence of phosphonate, the dissolution rate for 2% ammonium persulfate was limited to about 200 Å/min for a downforce of 2 psi or less, while increasing the phosphonate concentration resulted in an increase in the gold dissolution rate at the concentrations examined.

TABLE 1

Effect of varying phosphonate concentration on gold dissolution rate at a constant 2% ammonium persulfate concentration.

| Phosphonate Concentration (wt %) | Gold Dissolution Rate (Å/min)* |
|---|---|
| 0% | 210 |
| 0.5% | 212 |
| 1% | 375 |
| 2% | 630 |
| 4% | 1230 |

*Gold Dissolution Rate (Å/min) measured at about 0.1 V above the open circuit potential.

EXAMPLE 2

This example shows the effect of varying the concentration ammonium persulfate on oxidation and solubilization of gold utilizing electrochemical techniques.

The rates of dissolution of gold substrates were monitored electrochemically in solutions having a pH of about 9 and containing about 2% by weight of 1-hydroxyethylidene-1,1-diphosphonic acid (DEQUEST® 2010), and varying concentrations of ammonium persulfate, in water. An abrasive pad applied with down-force of about 2 psi was used to abrade the surface in each evaluation. The ammonium persulfate concentration was varied from about 1% to about 4% by weight (i.e., 1%, 2%, and 4%). The gold dissolution rate for each solution was assessed from potentiodynamic polarization curves by extrapolation of the anodic and cathodic currents to the open circuit potential. The calculated dissolution rates for each phosphonate concentration are recorded in Table 2.

TABLE 2

Effect of varying persulfate concentration on gold dissolution rate at a constant 2% phosphonic acid chelating agent concentration.

| Ammonium Persulfate Concentration (wt %) | Gold Dissolution Rate (Å/min) |
|---|---|
| 1% | 38 |
| 2% | 116 |
| 4% | 273 |

EXAMPLE 3

This Example demonstrates the effect of varying the pH level on gold dissolution rates, evaluated by electrochemical techniques.

The rates of dissolution of gold substrates were monitored electrochemically in solutions of varying pH containing about 2% by weight of 1-hydroxyethylidene-1,1-diphosphonic acid (DEQUEST® 2010) and about 4% by weight of ammonium persulfate, in water. An abrasive pad applied with down-force of about 2 psi was used to abrade the surface in each evaluation. The pH was varied from about 2 to about 9 (i.e., 2, 5, 8, and 9). The gold dissolution rate for each solution was assessed from potentiodynamic polarization curves by extrapolation of the anodic and cathodic currents to the open circuit potential. The dissolution rates observed at each pH value are recorded in Table 3. Use of amino-tris(methylenephosphonic acid (DEQUEST® 2000) in place of DEQUEST® 2010 afforded almost identical results.

TABLE 3

Effect of varying pH on gold dissolution rate at a constant 2% phosphonic acid chelating agent concentration and 4% ammonium persulfate concentration.

| pH | Gold Dissolution Rate (Å/min) |
|---|---|
| 2 | 1.5 |
| 5 | 2.1 |
| 8 | 25 |
| 9 | 252 |

EXAMPLE 4

This example demonstrates the effectiveness of CMP compositions of the invention comprising ammonium persulfate, alumina, and a phosphonic acid cheating agent for removing gold in small scale CMP polishing apparatus.

The removal rates of gold-containing substrates were monitored on a small scale polisher for CMP compositions having a pH of about 9 and containing varying levels of phosphonic acid chelating agent, ammonium persulfate, and alpha-alumina, in water. A hard polishing pad applied with down-force of about 2 psi, a platen rotation speed of about 50 rpm, a carrier rotation speed of about 53 rpm, and a slurry supply rate of about 200 mL/min was used to polish the gold surface of each substrate. The substrate was a Si wafer on which a 340 Å thin layer of titanium was deposited, followed by a 1600 Å thick layer of gold. The concentration of 1-hydroxyethylidene-1,1-diphosphonic acid (DEQUEST® 2010) was varied from about 0.5 to about 2.5% by weight, the amount of surface-treated alpha alumina was varied from about 1 to about 2% by weight, and ammonium persulfate was varied from about 2 to about 4% by weight. The gold removal rate in Å/min was determined for each composition. The observed gold removal rates and compositions are recorded in Table 4. The data clearly indicate that gold removal rates increases with the % of phosphonic acid chelating agent, as well as with the increasing levels of the oxidizing agent and abrasive. The removal rate also increased with increasing applied down force and increased platen speed.

TABLE 4

CMP compositions and gold removal rates obtained therewith.

| Wt % Alumina | Wt % $(NH_4)_2S_2O_8$ | Wt % Phosphonate | Gold Removal Rate (Å/min) |
|---|---|---|---|
| 1.5 | 3 | 2 | 952 |
| 1 | 2 | 1.5 | 686 |
| 1 | 2 | 2.5 | 962 |
| 2 | 2 | 2.5 | 1037 |
| 2 | 4 | 2.5 | 1253 |
| 2 | 2 | 1.5 | 706 |
| 1 | 4 | 1.5 | 878 |
| 2 | 4 | 1.5 | 859 |
| 1 | 4 | 2.5 | 1154 |
| 1.5 | 3 | 2 | 950 |

EXAMPLE 5

This Example demonstrates the effectiveness of a CMP composition of the invention comprising alumina and a reactive admixture of an iodate compound and iodide for oxidizing an solubilizing gold.

The gold removal rates of gold-containing substrates were monitored on a small scale polisher using a CMP compositions of the invention having a pH of about 5 to about 7 and containing about 2% by weight surface-treated alumina (i.e., surface treated with a polymer), and a reactive admixture containing about 2% by weight potassium hydrogen iodate and 2% by weight potassium iodide, in water. The CMP composition was applied to the platen in two parts (i.e., one containing potassium hydrogen iodate and alumina, and the other containing potassium iodide and alumina), each part having the 2× concentration of the final composition and mixed on the platen in approximately 1:1 ratio to obtain the final composition described above. A hard polishing pad applied with down-force of about 2 psi, a platen rotation speed of about 50 rpm, a carrier rotation speed of about 53 rpm, and a slurry supply rate of about 200 mL/min was used to abrade the gold surface of the substrate. The gold substrate was a Si wafer having a 100 Å tantalum layer, a 100 Å platinum layer and a 4000 Å gold layer deposited thereon. The observed gold removal rate was about 1800 Å/min.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A cyanide-free chemical-mechanical polishing (CMP) composition for polishing a gold-containing surface of a substrate comprising:
    (a) an abrasive;
    (b) a gold-oxidizing agent;
    (c) a cyanide-free gold-solubilizing agent comprising a phosphonic acid chelating agent, a salt thereof, or a combination thereof; and
    (d) an aqueous carrier therefor;
and wherein the cyanide-free gold-solubilizing agent is present in the composition at a concentration in the range of about 0.5% to about 6% on a weight basis.

2. The CMP composition of claim 1 wherein the gold oxidizing agent is present in the composition at a concentration in the range of about 0.5% to about 6% on a weight basis.

3. The CMP composition of claim 1 wherein the composition has a basic pH and the gold-oxidizing agent comprises a persulfate salt.

4. The CMP composition of claim 1 wherein the composition has an acidic pH and the gold-oxidizing agent comprises a halogen.

5. The CMP composition of claim 1 wherein the composition has an acidic pH and the gold-oxidizing agent comprises a reactive admixture of an oxyhalogen compound and a halide salt.

6. The CMP composition of claim 5 wherein the admixture of an oxyhalogen compound and a halide salt is selected from the group consisting of:
    (a) an iodate compound admixed with an iodide salt,
    (b) a bromate compound admixed with a bromide salt, and
    (c) a chlorate compound admixed with a chloride salt.

7. The CMP composition of claim 5 wherein the gold-oxidizing agent comprises an admixture of an iodate compound and an iodide salt, the iodate compound being present in the composition at an initial concentration of about 2% by weight and the iodide salt being present in the composition at an initial concentration of about 2% by weight.

8. The CMP composition of claim 1 wherein the phosphonic acid chelating agent comprises amino-tris(methylenephosphonic acid), 1-hydroxyethylidene-1,1-diphosphonic acid, or a combination thereof.

9. The CMP composition of claim 1 wherein the abrasive is present in the composition at a concentration in the range of about 0.1% to about 3% on a weight basis.

10. The CMP composition of claim 1 wherein the abrasive comprises alpha-alumina.

11. The CMP composition of claim 1 wherein the cyanide-free gold-solubilizing agent comprises a phosphonic acid chelating agent, the gold-oxidizing agent is ammonium persulfate, and the composition has a basic pH.

12. The CMP composition of claim 11 wherein the composition has a pH of about 9.

* * * * *